US009448286B2

(12) United States Patent
Min et al.

(10) Patent No.: US 9,448,286 B2
(45) Date of Patent: Sep. 20, 2016

(54) PREVENTIVE DIAGNOSTIC SYSTEM FOR GIS BASED ON IEC 61850

(71) Applicant: HYUNDAI HEAVY INDUSTRIES CO., LTD., Ulsan (KR)

(72) Inventors: Byoung Woon Min, Gyeonggi-do (KR); Jeong Bok Lee, Seoul (KR); Chang Sun Park, Ulsan (KR)

(73) Assignee: HYUNDAI HEAVY INDUSTRIES CO., LTD., Ulsan (KR)

( * ) Notice: Subject to any disclaimer, the term of this patent is extended or adjusted under 35 U.S.C. 154(b) by 588 days.

(21) Appl. No.: 13/934,681

(22) Filed: Jul. 3, 2013

(65) Prior Publication Data

US 2014/0012523 A1    Jan. 9, 2014

(30) Foreign Application Priority Data

Jul. 6, 2012   (KR) ......................... 10-2012-0073690

(51) Int. Cl.
*G01R 31/327*     (2006.01)
*H01H 33/26*      (2006.01)
(Continued)

(52) U.S. Cl.
CPC ............ *G01R 31/327* (2013.01); *H01H 33/26* (2013.01); *H04L 67/12* (2013.01); *G01R 31/1254* (2013.01); *H02B 13/0655* (2013.01); *H04L 67/125* (2013.01); *H04L 69/08* (2013.01)

(58) Field of Classification Search
CPC ............ G01R 31/327; G01R 31/1254; H01H 33/26; H02B 13/0655; H04L 67/125; H04L 67/12; H04L 69/08
USPC ............................... 702/58; 700/87, 83, 286
See application file for complete search history.

(56) References Cited

U.S. PATENT DOCUMENTS 7,046,166 B2 *  5/2006  Pedyash ................... H04Q 9/00
                                                    340/870.01
7,676,333 B2 *  3/2010  Younsi ............... G01R 31/1227
                                                         324/458

(Continued)

FOREIGN PATENT DOCUMENTS

CN          102495179 A       6/2012
CN          202693740 U   *   1/2013

(Continued)

OTHER PUBLICATIONS

H. Li, "Research on Technologies of Intelligent Equipment in Smart Substation." IEEE Innovative Smart Grid Technologies-Asia, 2012.

(Continued)

*Primary Examiner* — Carol S Tsai
(74) *Attorney, Agent, or Firm* — Blank Rome LLP

(57) ABSTRACT

According to an embodiment of the present disclosure, there is provided a preventive diagnostic system for a GIS that includes a plurality of data acquisition systems (DAS's), a central communication unit (CCU), and a local server. The DAS generates an ICD file representing a content of the configuration of the DAS using a logical node designed for the preventive diagnostic system for a GIS and delivers the ICD file to the CCU, and the CCU performs a network connection so as to communicate with the DAS in compliance with IEC 61850 based on a content of the ICD file delivered from the DAS. According to the embodiment of the present disclosure, by applying IEC 61850 to the preventive diagnostic system for a GIS, smooth integration with a substation automation system and an efficient operation can be achieved.

9 Claims, 2 Drawing Sheets

(51) Int. Cl.
| | |
|---|---|
| H04L 29/08 | (2006.01) |
| G01R 31/12 | (2006.01) |
| H02B 13/065 | (2006.01) |
| H04L 29/06 | (2006.01) |

(56) References Cited

U.S. PATENT DOCUMENTS

| | | | | |
|---|---|---|---|---|
| 7,962,659 | B2* | 6/2011 | Mann | G06F 15/177 710/12 |
| 8,868,360 | B2* | 10/2014 | Ganesh | G01R 31/1272 702/59 |
| 8,893,216 | B2* | 11/2014 | Yadav | H04L 63/0236 700/286 |
| 8,923,993 | B2* | 12/2014 | Kulathu | G05B 19/0426 700/286 |
| 2002/0065789 | A1* | 5/2002 | Witt | G06Q 20/20 705/400 |
| 2008/0189536 | A1* | 8/2008 | Mann | G06F 15/177 713/1 |
| 2009/0119035 | A1* | 5/2009 | Younsi | G01R 31/343 702/58 |
| 2012/0323381 | A1* | 12/2012 | Yadav | H04L 63/0236 700/286 |
| 2013/0204847 | A1* | 8/2013 | Murayama | H02J 3/00 707/691 |
| 2014/0074415 | A1* | 3/2014 | Rudolph | H04J 3/0644 702/60 |
| 2014/0325862 | A1* | 11/2014 | O'Shea | F26B 21/002 34/89 |

FOREIGN PATENT DOCUMENTS

| | | |
|---|---|---|
| KR | 10-2007-0121238 A | 12/2007 |
| KR | 10-2008-0094479 A | 10/2008 |

OTHER PUBLICATIONS

W. Xin et al., "Design of Intelligent Component for High Voltage GIS Based on IEC61850," 1st International Conference on Electric Power Equipment-Switching Technology, pp. 262-265, 2011.

"Visual IEC 61850-6, Communication Networks and System in Substations—Part 6" International Electrochemical Commission, Sep. 30, 2009.

Visual SCL for IEC 61850-6, Web page of Applied Systems Engineering, Inc., 2011.

G. Qiang et al., "High Voltage Equipment Online Monitoring System of Smart Substation." Innovative Smart Grid Technologies—Asia, 2012 IEEE.

L. Heinemann et al., "Modular Online Condition Monitoring System for Gas Insulated Switchgear." Transmission and Distribution Conference and Exposition, 2010 IEEE.

D-C Kim et al., "Development of GIS Condition Monitoring and Diagnosis System Based on IEC61850." International Conference on Condition Monitoring and Diagnosis, pp. 396-398, Sep. 23-27, 2012.

D. W. Gross et al., "Data Management for Parallel Partial Discharge Monitoring of Large GIS Fields." 2012 Annual Report Conference on Electrical Insulation and Dielectric Phenomena, 2012 IEEE.

M.Peiqing et al., "Modeling Method of Interaction System for Intelligent GIS Based on IEC61850." Advanced Materials Research, vols. 718-720, pp. 2163-2170, 2013.

Du Fengqing et al., "Information Modeling for GIS Smart Monitoring Based on IEC61850 and Development of Information Interaction System." Electric Power Automation Equipment, vol. 33, No. 6, pp. 163-167, 2013.

* cited by examiner

PREVENTIVE DIAGNOSTIC SYSTEM FOR GIS BASED ON IEC 61850

CROSS-REFERENCE TO RELATED APPLICATION

This application claims priority to Korean Patent Application No. 10-2012-0073690, filed on Jul. 6, 2012, and all the benefits accruing therefrom under 35 U.S.C. §119, the contents of which in its entirety are herein incorporated by reference.

BACKGROUND

1. Field

The present disclosure relates to a preventive diagnostic system for a GIS based on IEC 61850, and more particularly, to a preventive diagnostic system for a GIS based on IEC 61850 that enables communication between a DAS and a CCU to be made in compliance with the communication specification of IEC 61850 by applying IEC 61850 to the preventive diagnostic system for a GIS.

2. Description of the Related Art

Generally, a preventive diagnostic system for a gas insulated switchgear (GIS) is a system that measures gas leakage and partial discharge inside the GIS, which are indications of the breakage of insulation, detects a breakdown in advance, and takes measures thereto.

The request for a standard protocol for mutual compatibility between facilities inside substations and the automation of substations has increased. Accordingly, in order to constitute a mutual common protocol for easy extension and interfaces of substation facilities domestically and internationally, the International Electro-technical Commission (IEC) has constituted a substation protocol called IEC 61850.

Thus, all the power monitoring control equipment installed inside substations are regulated to follow IEC 61850.

However, currently, IEC 61850 has not been applied to preventive diagnostic systems for a GIS. Accordingly, there is a problem in that it is difficult to smoothly integrate a conventional preventive diagnostic system for a GIS with a substation automation system to which IEC 61850 is applied and to perform an efficient operation of such a preventive diagnostic system.

RELATED LITERATURES

Patent Literature (Patent Literature 1) Korean Patent Application Publication No. 10-2008-0094479
(Patent Literature 2) Korean Patent Application Publication No. 10-2007-0121238

SUMMARY

The present disclosure is directed to providing a preventive diagnostic system for a GIS based on IEC 61850 in which, when an ICD file is generated by a DAS and is delivered to a CCU, the CCU makes a connection with the DAS in accordance with the content of the ICD file such that communication between the DAS and the CCU is performed in compliance with the communication specification of IEC 61850.

In one aspect, there is provided a preventive diagnostic system for a GIS based on IEC 61850. The preventive diagnostic system includes: a plurality of data acquisition systems (DAS's) being installed in the GIS and receiving sensed data from a plurality of partial discharge sensors detecting an occurrence of partial discharge when the partial discharge occurs; a central communication unit (CCU) transferring the received sensed data to a local server in real time; and the local server generating report data using the sensed data received from the CCU and supplying the report data to a user through an HMI screen. The DAS generates an ICD file representing a content of the configuration of the DAS using a logical node designed for the preventive diagnostic system for a GIS and delivers the ICD file to the CCU, and the CCU performs a network connection so as to communicate with the DAS in compliance with IEC 61850 based on a content of the delivered ICD file.

In the aspect above, the CCU may include: a configuration tool generating a database used for a system operation, configuring a gateway system to which the DAS is connected and a system configuring the DAS, automatically generating tags, and selecting a value to be actually used from among many values of the DAS; an operation tool controlling operations of the DAS's; and a value viewer tool performing a monitoring and control function of values received from the DAS's.

In addition, the CCU may convert IEC 61850 data into channel data.

In addition, the DAS may include an IEC 61850 COM client that is responsible for an interface with the CCU so as to transmit constituent elements and a measured value to the CCU, and the IEC 61850 COM client may operate or stop the DAS in accordance with a DAS operation or stop command received from the CCU and control and monitor the DAS in accordance with a DAS control and monitoring command.

In addition, the ICD file may include: network information in which an IP address and a MAC address for MMS communication and GOOSE communication are set; service information in which functions serviceable in the DAS are defined; and logical node information in which information relating to the logical node provided by the DAS is defined.

In addition, a communication card capable of performing IEC 61850 communication may be mounted in a case where a CPU is not mounted in the DAS.

According to a preventive diagnostic system for a GIS, which is based on IEC 61850, according to the present disclosure, communication between a DAS and a CCU is performed in compliance with the communication specification of IEC 61850, and accordingly, smooth integration with a substation automation system and an efficient operation are achieved.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Hereinafter, a preventive diagnostic system for a GIS based on IEC 61850 according to a preferred embodiment of the present disclosure will be described in detail with reference to the accompanying drawings.

Figure 1:
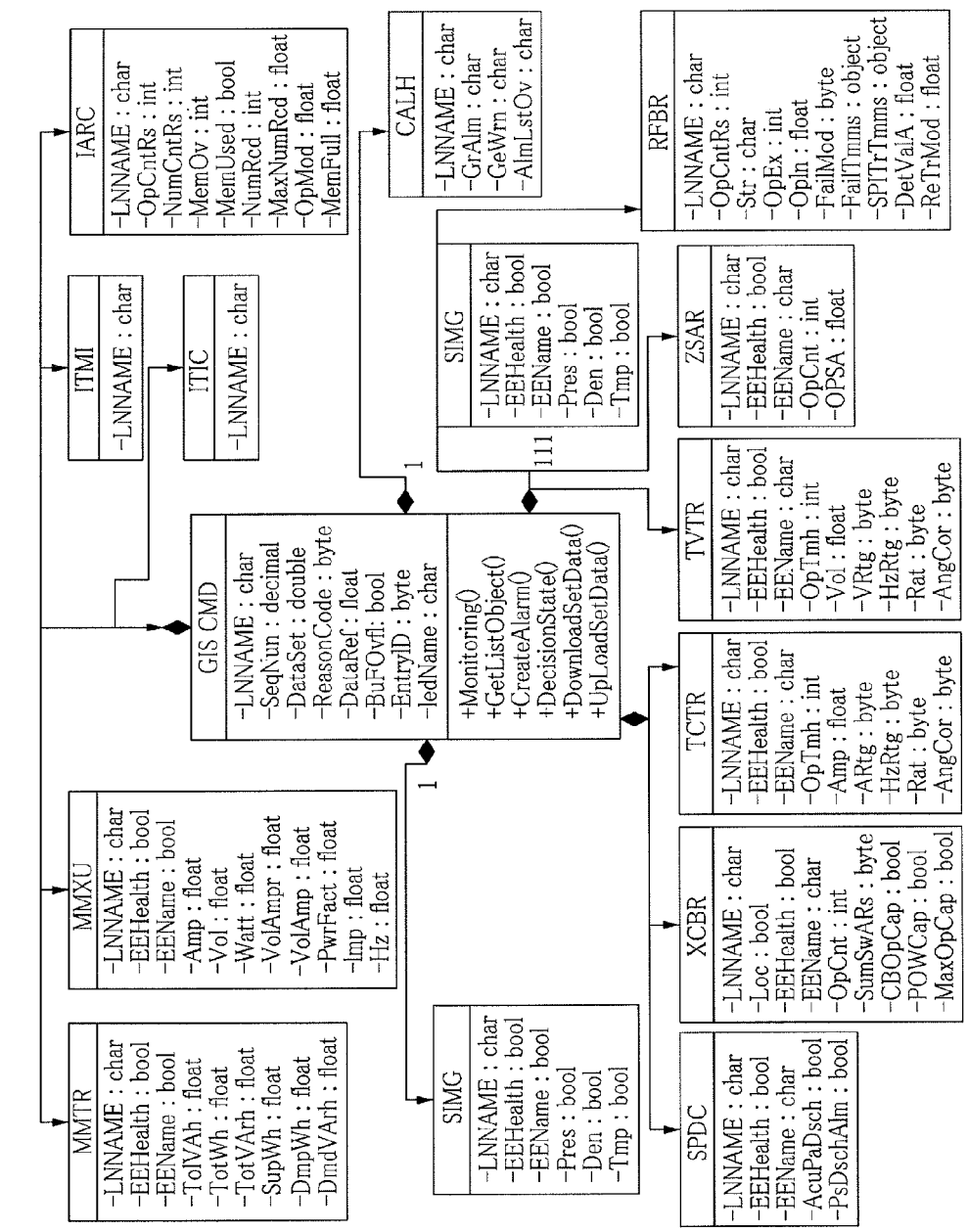
FIG. 1 is an exemplary diagram that illustrates a logical node drawing for a preventive diagnostic system for a GIS according to the present disclosure.

First, in order to implement a preventive diagnostic system for a GIS based on IEC 61850 according to the present disclosure, as illustrated in FIG. 1, a logical node (LN) for the preventive diagnostic system for a GIS is designed.

In order for the preventive diagnostic system for a GIS to perform communication in compliance with IEC 61850, information of a standard model is used, and the standard model is configured by a logical node, a logical data acquisition system (DAS), and a common data class (CDC). Data objects defined in IEC 61850 are mapped into objects defined in a manufacturing message specification (MMS) and perform MMS communication. A logical DAS is mapped into a domain object, a logical node and data are mapped into named variable objects, and a data set is mapped into a named variable list. In addition, a control block is mapped into a control block object, and a log is mapped into a journal object.

The MMS communication is performed in a form in which information is supplied to an MMS server in accordance with a request from an MMS client. For example, the MMS server acquires information matching actual hardware, that is, power facilities as one-to-one relation through ND conversion and stores the information. The stored information is actually stored in variable objects of the MMS server that are data and data attributes and is provided every time when there is a request from a client.

In accordance with this, in the present disclosure, as illustrated in FIG. 1, a logical node for the preventive diagnostic system for a GIS is designed.

Table 1 illustrates a logical node drawing for the preventive diagnostic system for a GIS illustrated in FIG. 1 as a table. Here, M represents an attribute that is essentially configured, and O represents an attribute that may be selectively configured, which are determined based on the implementation.

TABLE 1

| SMPD Class | | | | |
|---|---|---|---|---|
| Attribute Name | Attribute Type | Explanation | T | M/O |
| LNName | | | | |
| Data | | | | |
| Common Logical Node Information | | | | |
| EEhealth | INS | External Equipment health | | O |
| EEName | DPL | External Equipment Name | | O |
| OpCnt | INS | Operation Counter Measurement Value | | M |
| LPaDsch | INS | Partial Discharge Level | | C |
| VPaDsch | SAV | Partial Discharge Peak Measurement Value Status Information | | M |
| PsDschAlm | SPS | Occurrence/No-Occurrence of Partial Discharge | | C |
| CountPD | INS | Number of Occurrences of Partial Discharge | | M |
| LoPDx | INS | Partial Discharge Occurring Position X | | M |
| LoPDy | INS | Partial Discharge Occurring Position Y | | M |
| TyPD | INS | Partial Discharge Occurring Pattern | | M |
| MaxPD | INS | Discharge Amount of Maximal Partial Discharge | | M |
| LophPD | INS | Discharge Phase of Maximal Partial Discharge | | M |
| NoPD | INS | Noise pattern | | M |

Figure 2:
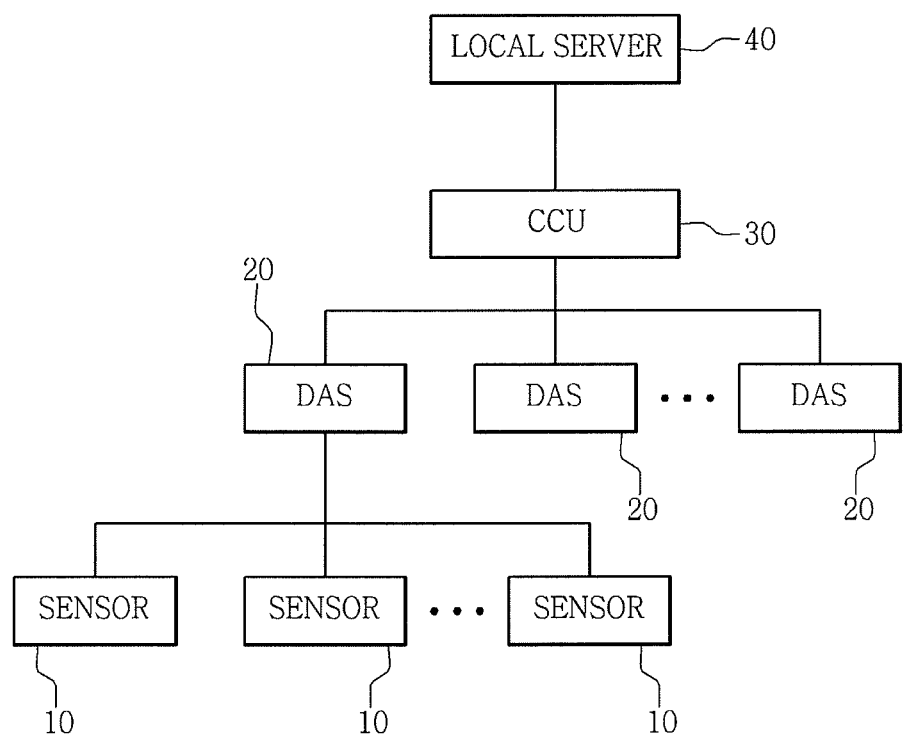
FIG. 2 is a schematic diagram that illustrates the configuration of a preventive diagnostic system for a GIS based on IEC 61850 according to an embodiment of the present disclosure.

FIG. 2 is a schematic diagram that illustrates the configuration of a preventive diagnostic system for a GIS based on IEC 61850 according to an embodiment of the present disclosure.

In FIG. 2, each partial discharge sensor 10 is installed to the GIS, detects the occurrence of partial discharge, and delivers sensed data to a DAS 20.

The DAS 20 receives sensed data from a plurality of the partial discharge sensors 10, processes the sensed data, and delivers the processed sensed data to a central communication unit (CCU) 30.

The above-described DAS 20 generates an ICD file representing the content of the configuration thereof using the logical node designed for the preventive diagnostic system for a GIS so as to communicate with the CCU 30 in compliance with IEC 61850 and delivers the generated ICD file to the CCU 30.

The ICD file is an extensible markup language (XML) file configured to have a tag-based structure in the form of a tree, and the content thereof is divided into network information in which an IP address and an MAC address used for MMS communication and general object oriented substation event (GOOSE) communication are set, service information in which functions that may be served in the DAS 20 are defined, logical node information in which information relating to logical nodes provided by the DAS 20 is defined, and report information in which information relating to reports provided by the DAS 20 is defined.

Meanwhile, the CCU 30 transmits the sensed data received from the DAS's 20 to a local server 40 in real time.

The above-described CCU 30 makes a network connection for communicating with the DAS 20 in compliance with IEC 61850 in accordance with the content of the ICD file delivered from the DAS 20 and communicates with the DAS 20 in compliance with IEC 61850.

The local server 40 generates report data using the real-time data received from the CCU 30 and supplies the generated report data to a user through an HMI screen.

In order to interface the DAS 20 and the CCU 30 in the format of IEC 61850, a memory map that is commonly applied needs to be configured. The memory map is defined in a substation configuration description (SCD) file and the ICD file and is applied by downloading necessary files such as the SCD file, the ICD file, an osicfg.xml file, and a logging.xml file from the CCU 30 to the DAS 20. Specifically, the existing communication protocol between the DAS 20 and the CCU 30 may be directly reflected on the memory map for IEC 61850.

In order to transmit the constituent elements and measurement values, and the like of each DAS 20, an interface with a higher-level system (CCU) is necessary, and an IEC 61850 COM client to which a component object model (COM) technology is applied performs such a role. The IEC 61850 COM client has functions for operating or stopping each DAS 20 and performing monitoring, control, and the like of measured values. In addition, the IEC 61850 COM client is configured to immediately respond when there is a request from a higher-level system. Major functions of the IEC 61850 COM client include a function for analyzing and providing the ICD file and the SCD file, a function for operating and stopping each DAS, and a function for controlling and monitoring each DAS.

The CCU 30 is configured to include a configuration tool, an operation tool, and a value viewer tool.

The configuration tool has a function for generating a database that is necessary to the system operating, and, as major functions thereof, there are a system configuration function, a tag generation function, and a mapping function.

Here, the system configuration function configures a gateway system (not illustrated in the figure) to which the DAS 20 is connected and the DAS 20. A plurality of DAS's 20 are installed in one gate system, and a maximum number of DAS's 20 is determined based on the capacity of the gateway system. The content of the configuration of the DAS 20 follows the international standard specification and, consequently, is stored in the XML format in accordance with the international standards. Thus, all the configurations of the DAS 20 that are compliant with the specification of IEC 61850 may be employed.

The tag generation function automatically generates tags. All the elements from a higher-level server to a lower-level I/O device have unique names called tags, and these tag names are elements that may be commonly used by mutually-different application programs.

Finally, the mapping function selects a value to be actually used from among many values of the DAS 20. All the monitoring elements of the DAS 20 are defined as international standard specifications. While all the monitoring elements may be used, only some of the monitoring elements may be used based on the properties thereof. Accordingly, when all the monitoring elements that are not actually used are managed, there is a large loss of resources, and the efficiency is low. Therefore, it is necessary to select necessary monitoring elements depending on the situation.

By controlling the operations of the DAS's 20, the operation tool is responsible for the operating or stopping each DAS 20 and may perform the operating or stopping of DAS's 20 altogether by selecting a higher-level group. When a DAS 20 is operated or stopped through the operation tool of the CCU 30, information and a command of the DAS 20 are delivered to the IEC 61850 COM client of the DAS 20. Thereafter, the IEC 61850 COM client directly issues a command to the DAS 20 in accordance with the command received from the operation tool of the CCU 30 and responses to the operation tool of the CCU 30 with the state.

The value viewer tool performs the function of monitoring and controlling a value received from each DAS 20. When an arbitrary DAS 20 is selected, the value viewer tool outputs a current value of the selected DAS 20 in real time. On the other hand, when a user inputs a value, the value viewer tool newly generates the value.

As described above, in the preventive diagnostic system for a GIS based on IEC 61850 according to the present disclosure, the CCU 30 communicates with the DAS's 20 arranged at the lower end in compliance with IEC 61850 so as to transmit or receive data. However, since a local server 40 that was developed in the past transmits or receives data in a channel data format of 17 frames, the local server cannot transmit or receive data that is in the format of IEC 61850.

Accordingly, it is preferable to load an IEC 61850 client, which is a program converting data having the format of IEC 61850 into the channel data format of 17 frames that may be received by the local server 40, into the CCU 30 in consideration of the compatibility with an existing system.

The above-described IEC 61850 client is configured to be able to perform IEC 61850 communication with DAS's 20 arranged at the lower end by registering "iec_mprocess.dll" as a COM. The IEC 61850 client may access the registered COM and extract necessary data of the DAS 20. Through this, the IEC 61850 client may extract data of all the DAS's 20 connected to the lower end of the CCU 30. Thereafter, the IEC 61850 client maps all the data of the DAS's 20 into channel data of 17 frames with being divided into analog tags and digital tags based on Tag_Mst and the mapping table of the database. Then, when a time synchronization signal is delivered from the local server 40, the IEC 61850 client transmits the mapped channel data to the higher-level local server 40. The local server 40 receives the data and stores the data in a shared memory such that an HMI and the other servers may access the data.

In the embodiment of the present disclosure, the DAS 20 in which a CPU is mounted has been described as an example. However, in a case where the CPU is not mounted in the DAS 20, it is preferable to mount a communication card capable of performing IEC 61850 communication in the DAS 20.

The preventive diagnostic system for a GIS based on IEC 61850 according to the present disclosure is not limited to the above-described embodiment and may be variously changed within a range allowed by the technical concept of the present disclosure.

What is claimed is:

1. A preventive diagnostic system for a gas insulated switchgear (GIS) based on IEC 61850, the preventive diagnostic system comprising:
a plurality of data acquisition systems (DAS's) being disposed in the GIS and receiving sensing data of partial discharge from a plurality of partial discharge sensors when the partial discharge occurs;
a central communication unit (CCU) transferring the received sensing data to a local server in real time; and
the local server generating report data using the sensing data received from the CCU and providing the report data to a user through an human machine interview (HMI) screen,
wherein the DAS generates an intelligent electronic device (IED) capability description (ICD) file representing a content of the configuration of the DAS using a logical node designed for the preventive diagnostic system for a GIS and provides the CCU with the ICD file, and
wherein the CCU performs a network connection so as to communicate with the DAS in compliance with IEC 61850 based on a content of the provided ICD file, and the CCU comprises:
a configuration tool generating a database used for a system operation, configuring a gateway system to which the DAS is connected and a system configuring the DAS, automatically generating tags, and selecting a value to be used from among a plurality of values of the DAS;
an operation tool controlling operations of the DAS's; and
a value viewer tool monitoring and controlling values received from the DAS's.

2. The preventive diagnostic system for a GIS based on IEC 61850 according to claim 1, wherein the CCU converts IEC 61850 data into channel data.

3. The preventive diagnostic system for a GIS based on IEC 61850 according to claim 1, wherein the CCU converts IEC 61850 data into channel data.

4. The preventive diagnostic system for a GIS based on IEC 61850 according to claim 1,
wherein the DAS comprises an IEC 61850 COM client that interfaces with the CCU so as to transmit constituent elements and a measured value to the CCU, and
wherein the IEC 61850 COM client operates or stops the DAS in accordance with a DAS operation or stop command received from the CCU and controls and monitors the DAS in accordance with a DAS control and monitoring command.

5. The preventive diagnostic system for a GIS based on IEC 61850 according to claim 1, wherein the ICD file includes:
network information in which a MAC address and an IP address for MMS communication and GOOSE communication are set;
service information including information for functions serviceable in the DAS; and
logical node information including information for the logical node provided by the DAS.

6. The preventive diagnostic system for a GIS based on IEC 61850 according to claim 1, wherein a communication card capable of performing IEC 61850 communication is mounted in a case where a CPU is not mounted in the DAS.

7. The preventive diagnostic system for a GIS based on IEC 61850 according to claim 1, wherein the ICD file comprises an extensible markup language (XML) file.

8. A preventive diagnostic system for a gas insulated switchgear (GIS) based on IEC 61850, the preventive diagnostic system comprising:
a plurality of data acquisition systems (DAS's) being disposed in the GIS and receiving sensing data of partial discharge from a plurality of partial discharge sensors when the partial discharge occurs;
a central communication unit (CCU) transferring the received sensing data to a local server in real time; and
the local server generating report data using the sensing data received from the CCU and providing the report data to a user through an human machine interface (HMI) screen,
wherein the DAS generates an intelligent electronic device (IED) capability description (ICD) file representing a content of the configuration of the DAS using a logical node designed for the preventive diagnostic system for a GIS and provides the CCU with the ICD file, and
wherein the CCU performs a network connection so as to communicate with the DAS in compliance with IEC 61850 based on a content of the provided ICD file and
wherein the DAS comprises an IEC 61850 COM client that interfaces with the CCU so as to transmit constituent elements and a measured value to the CCU, and
wherein the IEC 61850 COM client operates or stops the DAS in accordance with a DAS operation or stop command received from the CCU and controls and monitors the DAS in accordance with a DAS control and monitoring command.

9. A preventive diagnostic system for a gas insulated switchgear (GIS) based on IEC 61850, the preventive diagnostic system comprising:
a plurality of data acquisition systems (DAS's) being disposed in the GIS and receiving sensing data of partial discharge from a plurality of partial discharge sensors when the partial discharge occurs;
a central communication unit (CCU) transferring the received sensing data to a local server in real time; and
the local server generating report data using the sensing data received from the CCU and providing the report data to a user through an human machine interface (HMI) screen,
wherein the DAS generates an intelligent electronic device (IED) capability description (ICD) file representing a content of the configuration of the DAS using a logical node designed for the preventive diagnostic system for a GIS and provides the CCU with the ICD file, and
wherein the CCU performs a network connection so as to communicate with the DAS in compliance with IEC 61850 based on a content of the provided ICD file and
wherein the ICD file includes:
network information in which a MAC address and an IP address for MMS communication and GOOSE communication are set;
service information including information for functions serviceable in the DAS; and
logical node information including information for the logical node provided by the DAS.

* * * * *